United States Patent
Lowenthal et al.

(10) Patent No.: US 8,999,742 B1
(45) Date of Patent: Apr. 7, 2015

(54) SILICON MICROSPHERE FABRICATION

(71) Applicant: Nthdegree Technologies Worldwide Inc., Tempe, AZ (US)

(72) Inventors: Mark D. Lowenthal, Gilbert, AZ (US); Tricia A. Youngbull, Tempe, AZ (US); William J. Ray, Fountain Hills, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/101,554

(22) Filed: Dec. 10, 2013

(51) Int. Cl.
| | |
|---|---|
| *H01L 31/18* | (2006.01) |
| *B29C 39/00* | (2006.01) |
| *B29C 39/02* | (2006.01) |
| *B29C 39/38* | (2006.01) |
| *B29C 39/36* | (2006.01) |
| *B29C 39/26* | (2006.01) |
| *B29C 33/38* | (2006.01) |
| *B29K 105/00* | (2006.01) |
| *B29L 31/34* | (2006.01) |

(52) U.S. Cl.
CPC .......... *H01L 31/1804* (2013.01); *B29C 39/003* (2013.01); *B29C 39/02* (2013.01); *B29C 39/38* (2013.01); *B29C 39/36* (2013.01); *B29C 39/26* (2013.01); *B29C 33/3842* (2013.01); *B29K 2105/0064* (2013.01); *B29K 2105/251* (2013.01); *B29K 2909/08* (2013.01); *B29K 2995/0005* (2013.01); *B29K 2995/0094* (2013.01); *B29L 2031/3406* (2013.01)

(58) Field of Classification Search
CPC .................. H01L 2924/10253; H01L 31/0284
USPC .......................................................... 438/63
See application file for complete search history.

(56) References Cited

U.S. PATENT DOCUMENTS

| | | |
|---|---|---|
| 4,637,855 A | 1/1987 | Witter et al. |
| 5,556,791 A | 9/1996 | Stevens et al. |
| 6,106,739 A | 8/2000 | Stephens et al. |

(Continued)

FOREIGN PATENT DOCUMENTS

| | | |
|---|---|---|
| EP | 2182555 A1 | 5/2010 |
| WO | 2012102343 A1 | 8/2012 |

OTHER PUBLICATIONS

Zhengxin Liu, "Investigation on the Crystal Growth Process of Spherical Si Single Crystals by Melting" Journal of Crystal Growth, Jun. 27, 2009, pp. 4116-4122, <www.elsevier.com/locate/jcrysgro>.

*Primary Examiner* — Mamadou Diallo
(74) *Attorney, Agent, or Firm* — Patent Law Group LLP; Brian D. Ogonowsky

(57) ABSTRACT

Small silicon spheres, less than 200 um in diameter, are desirable for use in forming solar panels. To make such small spheres, a large-area glass substrate has etched in its surface millions of identical indentations, such as having diameters less than 200 um. A silicon ink, formed of a fluid containing nanoparticles of milled silicon, is then deposited over the substrate to completely fill the indentations, and the excess ink is removed. The ink is heated to evaporate the fluid and melt the silicon nanoparticles. A photonic system is used to rapidly melt the silicon. The melted silicon forms a sphere in each indentation by surface tension. Since the density of the silicon in the ink and the volume of each indentation are well defined, the volume of each sphere is well defined. The substrates are reusable. Hundreds of millions of spheres may be produced per minute using the process.

23 Claims, 2 Drawing Sheets

(56) References Cited

U.S. PATENT DOCUMENTS

| | | |
|---|---|---|
| 6,638,491 B2 | 10/2003 | Carberry |
| 6,780,219 B2 | 8/2004 | Singh et al. |
| 8,133,768 B2 | 3/2012 | Ray et al. |
| 8,410,712 B2 | 4/2013 | Schroder et al. |
| 2003/0080451 A1* | 5/2003 | Kitahara et al. .................. 264/7 |
| 2006/0185716 A1* | 8/2006 | Murozono et al. ............ 136/250 |
| 2007/0079749 A1* | 4/2007 | Nagashio et al. ................ 117/13 |
| 2008/0038555 A1* | 2/2008 | Sekine et al. ................. 428/402 |
| 2010/0084776 A1 | 4/2010 | Murozono et al. |
| 2014/0261674 A1* | 9/2014 | Youngbull et al. ............ 136/256 |

* cited by examiner

SILICON MICROSPHERE FABRICATION

FIELD OF THE INVENTION

This invention relates to forming precision microspheres of a material and, in particular, to forming microspheres of silicon.

BACKGROUND

It is a known technique to form a solar panel by depositing an array of silicon spheres over a metal substrate, then processing the silicon spheres to form diodes that convert sunlight to electricity, as described in U.S. Pat. No. 8,133,768.

U.S. Pat. No. 5,556,791 describes a process for forming such silicon spheres by first forming a fine powder of silicon, such as by grinding bulk silicon. This dry powder is referred to as feedstock. Next, a template (a stencil) having small holes formed through it is positioned on a conveyor belt. The holes are then completely filled with the feedstock. The template is then lifted to form uniform piles of the feedstock on the conveyor belt. The piles are then heated by an optical furnace which melts the silicon powder in each pile, and the melted silicon generally forms spheres by surface tension. The spheres are then cooled. The silicon spheres are then further processed and deposited on a substrate to form a solar panel. The silicon spheres have diameters of about 30 mils (762 um).

By using smaller spheres, such as less than 200 um, as a monolayer in a solar panel, there is a very high surface area to volume ratio, making the solar panel more cost effective. It is also beneficial during processing for the spheres to have the same size and electrical characteristics.

It would be extremely difficult to form uniform silicon spheres with diameters less than 200 um using the above-described process. For example, completely and uniformly filling 200 um or smaller holes in a stencil with dry silicon powder would be very difficult due to the frictional forces involved and the variable air gaps between the particles. Although laser drilling of holes less than 200 um to form a stencil is possible, creating a stencil with a sufficiently large number of laser drilled holes in close proximity (e.g., over a million) to make the sphere fabrication cost-effective would be impractical.

A known method for forming silicon spheres less than 200 um in diameter uses sieves to select milled silicon particles within a desired range of sizes, and then a high temperature plasma is used to melt the individual particles in a reducing atmosphere to spherodize the silicon (see U.S. Pat. No. 6,780, 219). This process wastes silicon, the extreme heat of the plasma (>2000 C) creates relatively defective spheres, the silicon dioxide spheres are created as a byproduct, and the process is highly energy intensive.

Another known method, described in EP2182555A1, forms silicon spheres of about 1 mm in diameter for solar cells. This process requires sieving roughly shaped silicon powder to obtain particles within a desired range, using a binder to form larger silicon granules generally the size and shape of the desired spheres by means of a tumbling granulator, and placing each individual granule in its own recess of a heating substrate. Conventional heating furnaces, such as resistive or inductive furnaces, are then used to melt the silicon powder in each granule, and the granules form spheres. This process is energy intensive, requires time for a quartz substrate to react with molten silicon, requires a time-consuming process of placing individual granules in recesses, has a limited throughput of about 20,000 granules per substrate, and reduces the longevity of the substrate.

What is needed is a cost-effective method for forming precision silicon spheres having diameters less than 200 um using a heating process that does not compromise the substrate.

SUMMARY

In one embodiment, very fine silicon powder is milled from high quality bulk silicon while the silicon is in a fluid, such as acetone, alcohol, ether, water, ethylene glycol, proplylene glycol or other liquid or combination of liquids, to create a silicon ink. The average size of the silicon particles may be from tens of nanometers to hundreds of nanometers or several microns in size, and the particles can have any shape.

The fluid may be any suitable evaporative or volatile organic or inorganic compound. Due to the fineness of the silicon particles, the particles stay suspended in the fluid for an extended period of time, remain uniformly dispersed, and can have a high bulk density. Dispersants and/or surfactants, such as fluorosurfactants, inorganic salts, or organic salts, can be added to stabilize the dispersion for longer periods of time.

A quartz substrate (e.g., a fused silica plate) is prepared as follows. A mask is used to define closely spaced indentations in the substrate. Each opening in the mask may have a diameter of about 10 um-100 um. The openings may be circular, hexagonal, or other shapes.

The substrate is then subjected to one of, or a combination of, wet and dry etching to form a large number of closely spaced indentations in the substrate with diameters around 200 um or less. The indentions have rounded sides and the bottom of each indentation may be rounded or flat.

Alternatively, the indentations may be created using laser drilling. In this case, a laser is used to ablate indentations into the quartz. An ultraviolet or carbon dioxide laser can be used to make these indentations. Once the indentations have been formed, the entire surface of the substrate is then coated with a thin film that repels the silicon ink to prevent wetting of the substrate by the silicon ink. This coating may be reapplied occasionally or even each time the substrate is reused.

The silicon ink is then coated over the surface of the substrate to fill the indentations. A squeegee may be used to force the silicon ink into the indentations and remove excess ink. The excess ink is recycled. The volume of the silicon in each indention is substantially the same volume since the density of the silicon particles in the ink is substantially uniform.

The ink is heated to evaporate the fluid. The dry silicon particles are then rapidly heated (e.g., in less than 10 ms), using a furnace, to melt the silicon particles to form precision silicon spheres by surface tension. An optical furnace is preferably used, in which case the light that is not absorbed by the silicon is primarily transmitted through the transparent substrate, so the silicon is selectively heated relative to the substrate. Preferential heating of the silicon is achieved so the substrate with the indentations does not react with the silicon and can be reused.

Several methods can be used to increase the efficiency of the melting process to optimize the cost-effectiveness of this manufacturing process. A reflective metal layer, such as aluminum, may be added to the back of the quartz to reflect optical energy back into the silicon. A protective surface layer such as silicon nitride can be deposited over the quartz substrate to limit reaction with the silicon ink during melting and/or increase the longevity of the substrate.

Pulsed radiation thermal processing, a type of optical furnace, as described in U.S. Pat. No. 8,410,712, may also be used to melt the silicon most efficiently. With the pulsed radiation thermal process, the power, length, and frequency of the pulse can be tuned to achieve the exact heating profile required to efficiently melt and cool the silicon. The substrate may also be convectively heated to reduce the peak power required by the optical furnace, which minimizes the entire energy cost of the process.

The spheres are then rapidly cooled by removing application of the light and/or the quartz plates from the furnace.

Since the indentations are defined using photolithography (such as by a large-scale mask or by a step and repeat exposure process), the processed quartz substrate is inexpensive and can be large, such as 1 square meter. Therefore, a single substrate may produce 100 million silicon spheres during a single process. The substrate is reusable.

In addition to the extremely high throughput, the quality of the spheres can be higher than the prior art's larger spheres. Higher quality includes greater crystallinity, fewer grain boundaries, and a lower concentration of impurities due to the rapid melting. Further, since the spheres are very small, the surface tension results in more precise spherical shapes, since the low weight of the silicon relative to the sphere's surface area does not compress the sphere's shape.

The spheres may then be removed from the indentations, printed as a monolayer on a metal substrate and further processed to form diodes in a solar panel.

Spheres of materials other than silicon may also be formed using this process.

Other embodiments are described.

BRIEF DESCRIPTION OF THE DRAWINGS

Elements that are the same or similar are identified with the same number.

DETAILED DESCRIPTION

Figure 1:
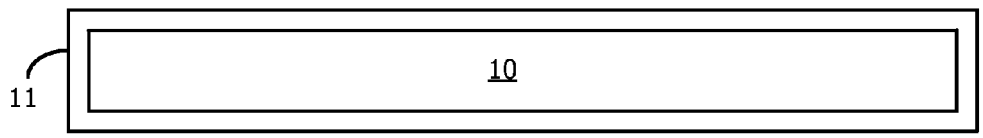
FIG. 1 is a cross-sectional view of a rectangular quartz substrate coated with amorphous silicon deposited by physical or chemical vapor deposition.

FIG. 1 is a cross-sectional view of a substrate 10, which may be rectangular and having a surface area of about one square meter, or any other suitable size. The substrate 10 can be any thickness, such as 5 mm-1 cm. The substrate 10 may be fused silica or synthetic fused silica (also referred to as quartz) or other material that can withstand the heat used in the process and can be easily etched. The substrate 10 is substantially transparent.

A hard mask 11, such as amorphous silicon, is uniformly deposited over the quartz substrate 10 by physical or chemical vapor deposition.

Figure 2:
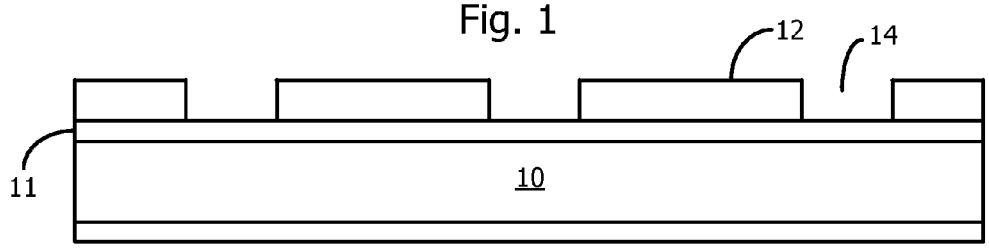
FIG. 2 is a cross-sectional view of a small portion of the substrate of FIG. 1 after a photoresist mask has been formed, cutting across three openings in the photoresist mask, with their pitch increased for illustration.

As shown in FIG. 2, a photoresist mask 12, or soft mask, is then patterned over the hard mask 11, using conventional photolithographic techniques, to form an array of openings 14, each opening having a diameter of about 10 um-100 um, depending on the desired size of the spheres. FIG. 2 is a cross-sectional view of a very small portion of the substrate 10 cutting across three openings 14 in a mask 12.

Figure 3:
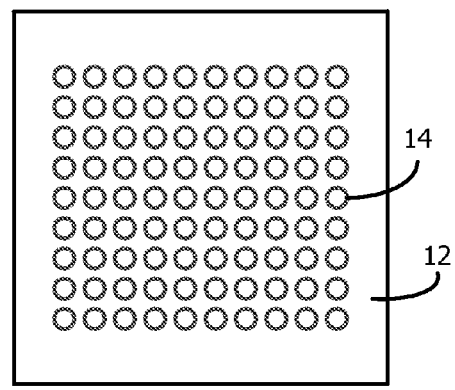
FIG. 3 is a top view of the quartz substrate showing the mask having an array of openings, where the openings are greatly magnified.

FIG. 3 is a top down view of the entire substrate 10 having the photoresist mask 12 formed over it, defining openings 14. The openings 14 may be arranged in a rectangular or hexagonal array, or another pattern. The openings 14 may be circular, hexagonal, or another shape. Closely spaced hexagonal openings arranged in a hexagonal array, resembling a honeycomb, are preferred to obtain a maximum density of openings. In one embodiment, the mask 12 has as many as 100 million openings over a 1 square meter substrate 10 for forming 100 million silicon spheres during a single process flow.

In one embodiment, the width of each opening 14 is about 20 um prior to etching to form spheres in the range of 75-50 um, since the etchant etches the substrate 10 isotropically under the hard mask 11. Due to the large size of the substrate 10, the mask 12 may be patterned using a large-area mask or by a standard step and repeat photolithographic exposure, followed by development.

Figure 4:
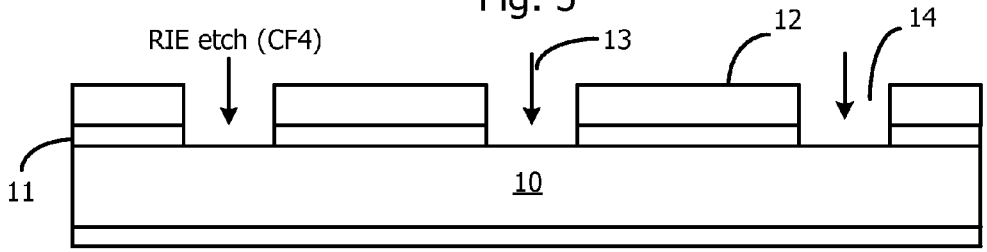
FIG. 4 illustrates the substrate of FIG. 2 during RIE etching, which etches through the amorphous silicon to expose the quartz substrate.

FIG. 4 illustrates the substrate 10 undergoing a Reactive Ion Etch (RIE) etching process 13 to etch through the hard mask 11 and expose the quartz substrate 10.

The photoresist mask 12 is then stripped off by dissolving it.

Figure 5:
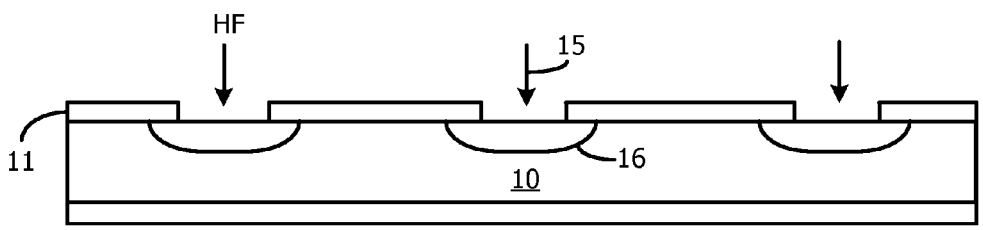
FIG. 5 illustrates the substrate of FIG. 4 during wet etching to form many millions of indentations in the substrate.

FIG. 5 illustrates the substrate 10 undergoing a wet etch, using an HF solution 15. The wet etching is isotropic so etches vertically and horizontally. Therefore, the depth of the resulting indentations 16 is approximately equal to the horizontal etching under the hard mask 11.

Depending on the width of the openings 14, the indentations 16 may have a rounded bottom or a flat bottom with rounded side walls. If hexagonal openings 14 are used, the wet etch still produces indentations 16 with rounded sides and a partially rounded bottom. The required depth of the indentations 16 is determined by the volume of silicon ink needed to create silicon spheres of a certain size. In one embodiment, the depth may be on the order of 50 um for spheres about 75 um-50 um in diameter, depending on the density of the silicon ink.

Alternatively, the indentations 16 may be created using laser drilling. In this case, a laser is used to ablate indentations 16 into the quartz substrate 10. An ultraviolet or carbon dioxide laser can be used to make the indentations 16.

Figure 6:
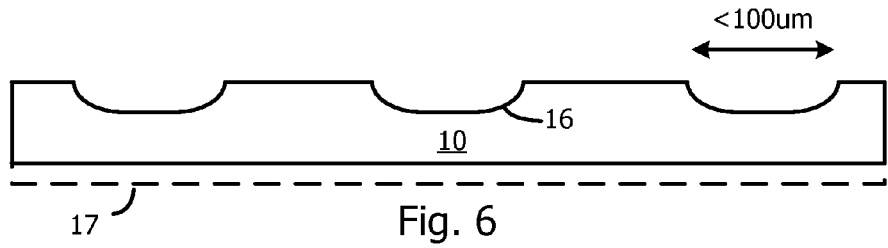
FIG. 6 illustrates the substrate of FIG. 5 after the amorphous silicon mask is removed.

FIG. 6 illustrates the substrate 10 after removal of the hard mask 11 using a conventional etchant for amorphous silicon.

A reflective metal layer 17, such as aluminum, may be deposited on the back of the transparent quartz substrate 10 to reflect optical energy back into the silicon during a subsequent heating step. The metal layer 17 may be a laminated, sputtered, printed, or deposited in other ways.

A thin film (not shown) is then formed on the surface of the substrate 10 to prevent wetting of the surface by the silicon ink, resulting in high interfacial surface tension between the substrate and the silicon ink. The optimal film is dependent on the silicon ink fluid used. In one embodiment, the film is a functionalized alkyl silane, which is conventionally used as a water repellant (a hydrophobic film). Many alkyl silanes are available to tune the interfacial energy.

A silicon ink may be prepared in a number of different ways.

In one embodiment, bulk silicon is milled by a fine grinder, conventionally used to form powder from bulk materials. The average diameter of the grains (nanoparticles) may be on the order of tens of nanometers. In another embodiment, the average diameter of the grains is less than 1 um. Uniformity of the grains is not required to achieve uniformity of the silicon spheres. Such grinding devices are known, and suitable silicon nanoparticles may be purchased from various companies.

The silicon powder is then mixed in a suitable fluid, such as acetone, alcohol, ether, water, ethylene glycol, propylene glycol or other liquid or semi-liquid, to create the silicon ink. The fluid may be any suitable evaporative or volatile organic or inorganic compound. Due to the fineness of the silicon particles, the particles stay suspended in the fluid for an extended period of time, remain uniformly dispersed, and can have a high bulk density. Dispersants and/or surfactants, such as fluorosurfactants, inorganic salts, or organic salts, can be added to stabilize the dispersion for longer periods of time.

The term fluid includes any suitable liquid or semi-liquid medium at the process temperature.

In another embodiment, relatively large pieces of silicon, already within the fluid, are milled by rotating grinding surfaces within the fluid until the silicon particles are of the desired small size. Such a wet milling process is generally described in U.S. Pat. No. 6,638,491, incorporated herein by reference.

Figure 7:
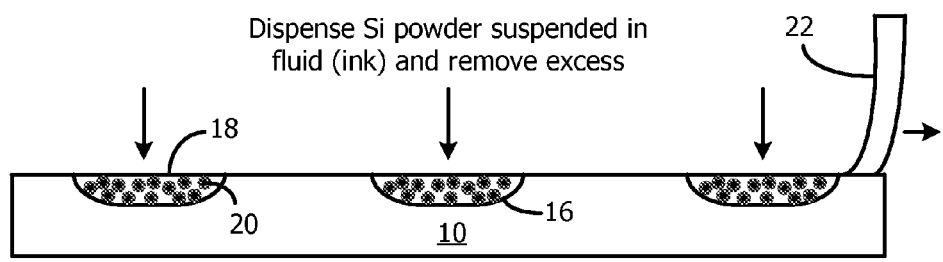
FIG. 7 illustrates the substrate of FIG. 6 after the indentations are filled with a silicon ink.

As shown in FIG. 7, the silicon ink 18, containing the silicon nanoparticles 20, is dispensed over the entire surface of the substrate 10 by spraying, printing, or by any other suitable process, to completely fill the indentations 16. A squeegee 22 is then passed over the surface of the substrate 10 to further urge the ink 18 into the indentations 16 and remove the excess ink 18 from the surface. The excess ink 18 is then recycled. The surface of the substrate 10 is now planar.

Figure 8:
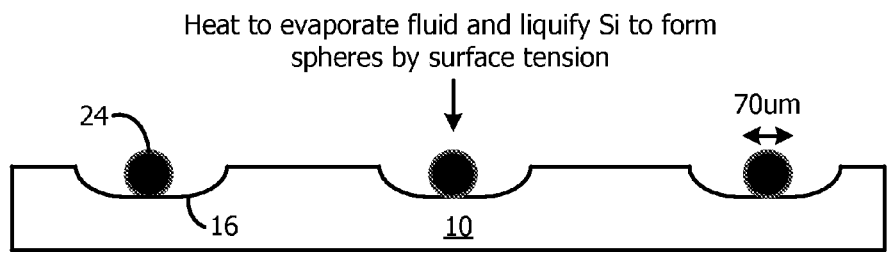
FIG. 8 illustrates the substrate of FIG. 7 after the silicon ink is heated to evaporate the fluid and melt the silicon powder to form uniform silicon spheres down to 20 um in diameter.

As shown in FIG. 8, the surface of the substrate 10 is subjected to a two-step heating process. First, the fluid part of the ink 18 is evaporated at a first heat level to cause only the silicon nanoparticles 20 to remain in the indentations 16. Such heating may be performed in an oven or using any other suitable heating process.

Next, using a Novacentrix PulseForge™ 3000x2 system or similar optical heating system, the silicon nanoparticles 20 are melted (liquefied) in less than 30 milliseconds and form a silicon sphere 24 by surface tension (a cohesive force). It has been shown that molten silicon has a surface tension of $783.5\times10^{-3}$ N/m at 1410 C (+/-3-4%). The Novacentrix system comprises a heating lamp that is pulse width modulated to generate the required heating profile. The system does not substantially heat the substrate 10 since it is substantially transparent. Other suitable photonic curing systems are also commercially available from Novacentrix and other manufacturers.

U.S. Pat. No. 8,410,712 describes a suitable pulsed radiation thermal process to melt the silicon. All patents mentioned herein are incorporated by reference.

If the reflective metal layer 17 (FIG. 6) is used, the light passing through the substrate 10 is reflected upward to further heat the silicon nanoparticles 20.

With the pulsed radiation thermal process, the power, length, and frequency of the pulse can be tuned to achieve the exact heating profile required to efficiently melt and cool the silicon. The substrate may also be convectively heated to reduce the peak power required by the optical furnace, which minimizes the entire energy cost of the process.

The spheres 24 are then rapidly cooled (because of their small size) below their solidification temperature simply by removing application of the light. Active cooling may be used if decelerated cooling is desired. Accordingly, the entire volume of the silicon nanoparticles 20 contained in an indentation 16 forms a sphere 24. Since the density of the nanoparticles 20 is uniform in the ink 18, and the volume of each indentation 16 is uniform, the spheres 24 are of uniform size. Since there are many nanoparticles 20 that make up a single sphere 24, the individual differences in nanoparticle shape and size are not relevant, since the average size of the nanoparticles 20 in each indentation 16 is the same.

Uniform spheres 24 are also created with hexagonal openings 14, since the silicon nanoparticles 20 still accumulate during melting to form a sphere by surface tension.

By selecting the density of the silicon nanoparticles 20 in the ink 18 and the volumes of the indentations 16, any sphere size can be obtained, such as down to 20 um in diameter. The process forms spheres 24 with less than 5% total variance in the final sphere diameter, such as ±3.5 um with a 70 um mean diameter. The printing process can tolerate 10% variance in the final sphere diameter.

If required, the spheres 24 may be further processed by rapid melting and cooling to improve the crystallinity and bulk chemical purity of the spheres. Since the small spheres 24 can be melted and cooled very quickly, higher crystallinity and a lower impurity concentration can be achieved. Additional processes may be performed on the spheres 24, depending on the final application for the spheres 24.

The spheres 24 may then be removed from the substrate 10 by an air knife and vacuum, or by tilting the substrate 10 while vibrating it, or by other means such as brushing, blowing, or collection in a fluid.

The substrate 10 of FIG. 6 may be reused many times.

By mounting a continuous series of the substrates 10 of FIG. 6 on a conveyor system, along with providing a silicon ink 18 dispenser, squeegee 22, and photonic system at stages along the conveyor, the process flow may fabricate, for example, 3 square meters/minute, where each square meter produces over 100 million spheres 24. A typically throughput may be greater than 100 kg of silicon spheres 24 per hour.

Instead of using a reflective metal layer 17 (FIG. 6) on the back of the substrate 10, the conveyor belt itself may be provided with a reflective surface underlying the substrate 10 to reflect back the optical energy when heating the silicon.

Further, a thermal insulator layer may be added between the quartz substrate 10 and the conveyor belt to increase the thermal mass of the substrate 10. This maintains a greater temperature gradient between the silicon and the substrate 10 and can be desirable for controlled heating/cooling.

Figure 9:
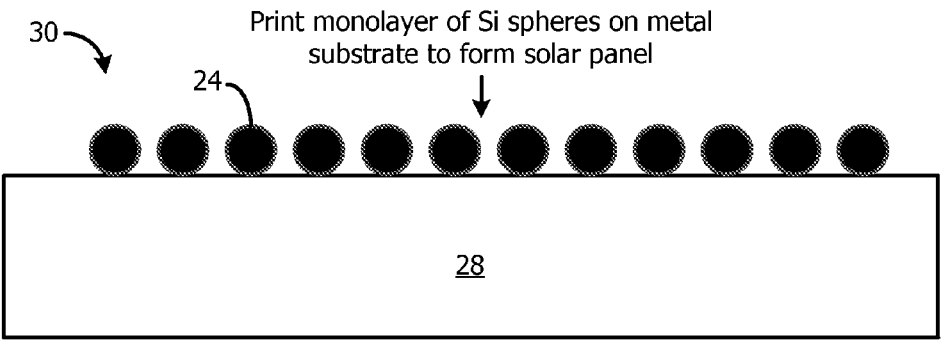
FIG. 9 is a cross-sectional view of a portion of a solar panel during fabrication showing a monolayer of the silicon spheres of FIG. 8 being printed on a metal substrate.

As shown in FIG. 9, the spheres 24 may be uniformly dispersed in another solvent system to make a silicon slurry and printed on a metal (e.g., aluminum) substrate 28 as a monolayer in the formation of a solar panel 30. The spheres 24 may be p-type, and their top surface may be doped n-type, after being printed on the metal substrate 28, to form pn junction diodes, with the cathodes on top and the anodes in ohmic contact with the metal substrate 28. A transparent conductor may be formed to contact the top cathodes of the diodes, and the transparent conductor and metal substrate 28 are electrically connected to a voltage converter. Sunlight impinging on the diodes, through the transparent conductor, produces a voltage between the anodes and cathodes that is used to charge a battery or drive an electrical load directly. Techniques for forming such solar panels using silicon spheres are described in U.S. Pat. No. 8,133,768, assigned to the present assignee and incorporated herein by reference.

For use in solar panels, the preferred sizes of the spheres 24 made using the present process are 20-200 um. By using very uniform silicon spheres when making the solar panel, the surface can easily be planarized for the various processes, including making electrical contact to the tops of the spheres.

The process may be used for forming small spheres of other types of materials as well, such as other semiconductor materials, dielectric materials, metals, etc. Additionally, the ink used to make the spheres may be a mixture of nanoparticles of different materials, and the resulting spheres form a substantially homogeneous alloy of the materials in the ink due to the melting of the mixture.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method comprising:
   providing a substrate having indentations, each indentation having a first volume;
   providing an ink containing particles of at least a first material suspended in a fluid;
   depositing the ink in the indentations to completely fill the indentations, wherein the ink is substantially planar with a top surface of the substrate;
   heating the ink to evaporate the fluid and melt the first material such that the melted first material substantially forms a sphere;
   cooling the spheres; and
   removing the spheres from the substrate.

2. The method of claim 1 wherein the first material comprises silicon.

3. The method of claim 1 wherein the melted first material forms spheres by surface tension.

4. The method of claim 1 wherein the fluid only contains the first material.

5. The method of claim 1 wherein the spheres have a diameter between 20 um to 200 um.

6. The method of claim 1 wherein the indentions have rounded sides.

7. The method of claim 1 wherein the substrate comprises a transparent glass.

8. The method of claim 1 wherein the particles of the first material comprise nanoparticles of the first material having average diameters less than 1 um.

9. The method of claim 1 wherein the step of providing the substrate comprises:
   providing the substrate with a flat surface;
   patterning a mask layer over the flat surface to form holes in the mask layer;
   etching the substrate though the holes to form the indentations; and
   removing the mask layer.

10. The method of claim 9 wherein patterning the mask layer comprises:
    depositing an amorphous silicon mask layer over the substrate;
    depositing a photoresist mask layer over the amorphous silicon mask layer;
    patterning the photoresist mask layer to form openings in the photoresist layer to expose the underlying amorphous silicon mask layer;
    performing a Reactive Ion Etch (RIE) to etch the exposed amorphous silicon mask layer to form the holes; and
    performing a wet etch of the substrate through the holes to form the indentations.

11. The method of claim 1 further comprising forming a film over the substrate to repel the fluid in the ink.

12. The method of claim 1 wherein the indentations are circular.

13. The method of claim 1 wherein the indentations are hexagonal.

14. The method of claim 1 wherein a volume of the first material filling an indentation substantially equals a volume of the sphere formed in the indentation.

15. The method of claim 1 wherein the step of heating comprises a two-step heating process comprising:
    heating the fluid at a first temperature to evaporate the fluid so that the first material remains in each indentation; and
    photonically heating the first material to a second temperature, higher than the first temperature, to melt the first material and form the spheres by surface tension.

16. The method of claim 1 wherein the number of indentations in the substrate is greater than 1 million.

17. The method of claim 1 wherein the ink containing the particles of the first material is a first ink, the method further comprising:
    forming a second ink containing the spheres; and
    printing the second ink on a conductive substrate during a process to form a solar panel.

18. The method of claim 1 wherein the first material comprises a milled powder of the first material.

19. The method of claim 1 wherein the step of heating comprises photonically heating the first material to melt the first material and form the spheres, wherein a reflector in proximity to the backside of the glass substrate reflects light during the photonic heating toward the indentations to increase heating of the first material.

20. The method of claim 1 further comprising, prior to the step of heating, removing any of the ink off a surface of the substrate that is not in the indentations.

21. The method of claim 1 wherein the step of depositing the ink in the indentations to completely fill the indentations comprises:
    coating the top surface of the substrate with the ink; and
    moving a squeegee over the top surface of the substrate to force the ink into the indentations and remove excess ink.

22. The method of claim 1 wherein the substrate is transparent and moved on a conveyor system.

23. The method of claim 22 wherein the conveyor system has a reflective surface for reflecting optical energy that passes through the substrate toward the first material filling the indentations during the step of heating the ink to melt the first material.

* * * * *

UNITED STATES PATENT AND TRADEMARK OFFICE
CERTIFICATE OF CORRECTION

| | | |
|---|---|---|
| PATENT NO. | : 8,999,742 B1 | Page 1 of 1 |
| APPLICATION NO. | : 14/101554 | |
| DATED | : April 7, 2015 | |
| INVENTOR(S) | : Mark D. Lowenthal et al. | |

It is certified that error appears in the above-identified patent and that said Letters Patent is hereby corrected as shown below:

In the Claims

Column 7
Line 57, Claim 9, where "though" should read --through--.

Signed and Sealed this
Twenty-first Day of July, 2015

Michelle K. Lee
*Director of the United States Patent and Trademark Office*